VOLTAGE GENERATOR
Filed Oct. 10, 1947
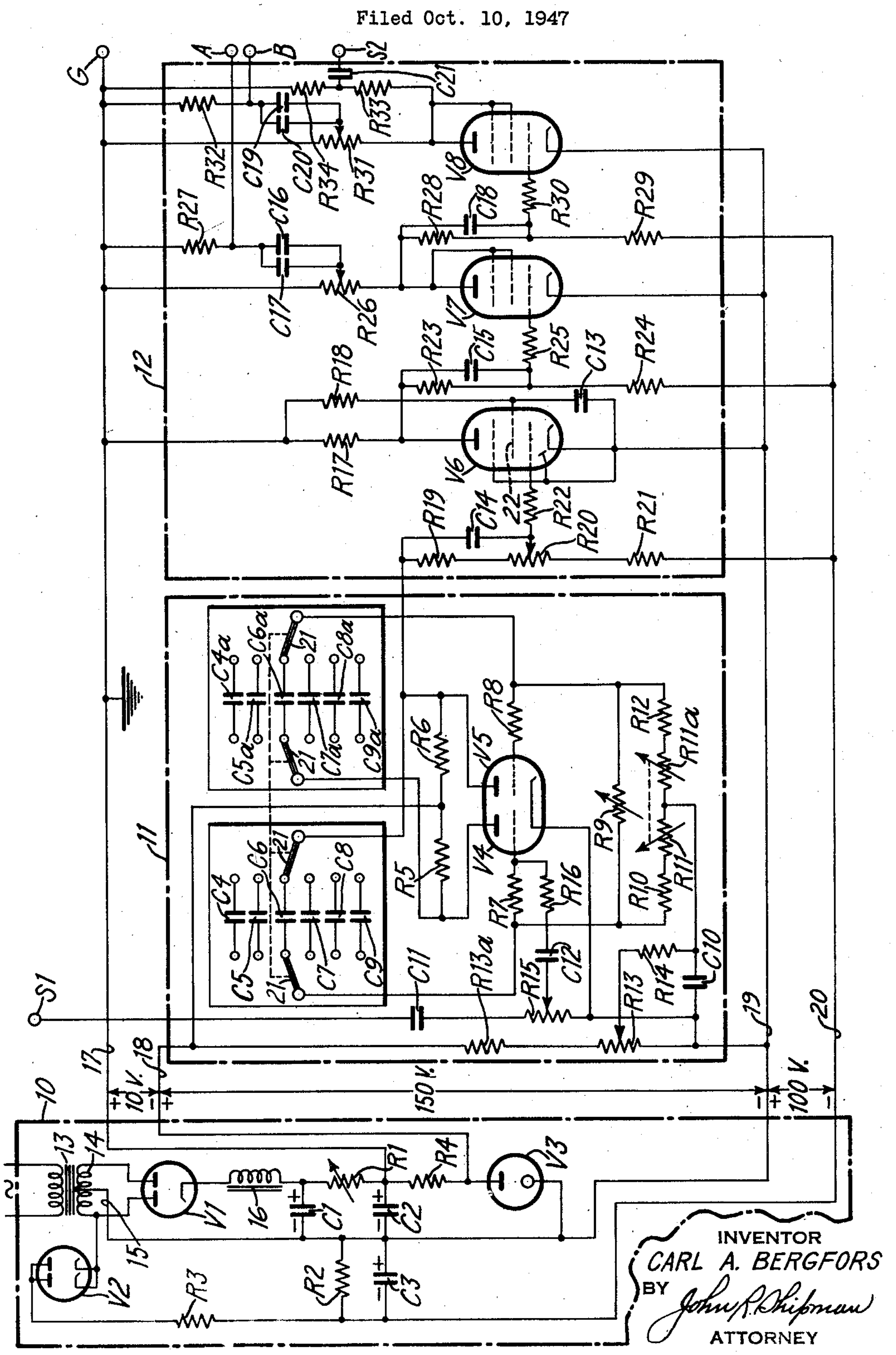
INVENTOR
CARL A. BERGFORS
BY John R. Shipman
ATTORNEY Patented July 4, 1950 2,514,023

UNITED STATES PATENT OFFICE 2,514,023

VOLTAGE GENERATOR

Carl A. Bergfors, Yonkers, N. Y., assignor to International Business Machines Corporation, New York, N. Y., a corporation of New York Application October 10, 1947, Serial No. 779,031

1 Claim. (Cl. 178—44)

This invention relates to a square wave generator and has particular relation to a generator employing an oscillator and an amplifier.

In prior arrangements, a well shaped square wave is customarily generated by apparatus comprising a multivibrator oscillator and electronic limiter or clipper amplifier circuits coupled thereto. By a well shaped square wave is meant one in which the leading and trailing wave fronts are substantially vertical while the tops and bottoms of the wave are substantially horizontal. While such prior apparatus may be satisfactorily operated over a range of frequencies, the frequency band within which a well shaped square wave may be obtained is not as wide as is many times desirable.

The principal object of the invention is to provide a new and improved square wave generator operable over an extremely wide band of frequencies.

Another object is to provide a novel square wave generator which is operable over a frequency band of the order of 1 to 800,000 cycles per second.

A further object is to provide an improved square wave generator comprising a multivibrator oscillator with clipper amplifier circuits coupled thereto which is operable over an extremely wide frequency band and provides a well shaped square wave at any frequency in the band.

My invention arises from the realization that in prior apparatus, as described above, the width of the frequency band is limited largely by the nature of the coupling between the multivibrator and amplifier and between successive stages of the amplifier. Usually, a coupling capacitor is employed. However, for low frequencies the capacitor must have a very large capacity and consequently must either be extremely large or be of the electrolytic type, the leakage resistance and instability of which makes it undesirable as a coupling capacitor at such points in the generator. Thus, the use of a coupling capacitor for very low frequencies is believed to be impractical.

On the other hand, a direct resistive coupling is satisfactory for low frequencies but is not satisfactory for either the high frequencies within the band of oscillations of the square wave generator or the high frequencies represented by the steep wave front of each individual pulse of the square wave. At high frequencies the input capacitance of the amplifier tube becomes of considerable importance with a direct resistive coupling. This input capacitance in such an arrangement causes an exponential time delay between a change in the output voltage of the oscillator and the corresponding change in grid voltage of the amplifier tube which delay precludes a substantially vertical wave front output for the amplifier.

Accordingly, it is also an object of the invention to provide an improved square wave generator having a wide frequency band coupling between an oscillator and an amplifier and between successive stages of an amplifier which coupling incorporates the advantages of a direct resistive coupling at low frequencies and of a capacitive coupling at high frequencies.

Other objects of the invention will be pointed out in the following description and claims and illustrated in the accompanying drawing, which discloses, by way of example, the principle of the invention and the best mode, which has been contemplated, of applying that principle.

In the drawing:

The single figure is a schematic wiring diagram of a square wave generator embodying my invention.

As shown in the drawing, the square wave generator is made up of a power supply unit 10, a multivibrator oscillator 11 and a three stage clipper amplifier 12. Conventional cathode heater circuits for tubes in the various units are omitted from the drawing for clarity.

The power supply unit is energized from an alternating current source through a transformer 13. A rectifier tube V1 has its two anodes connected to opposite ends of a secondary winding 14 of the transformer 13. The cathode of rectifier V1 is connected to a center tap 15 on the secondary winding 14 through a choke coil 16 in series with a capacitor C1 whereby a D. C. voltage of the polarity indicated in the drawing is provided across capacitor C1. Another capacitor C2 and a semi-variable resistor R1 are connected in series across the capacitor C1 to provide a D. C. voltage on the capaictor C2 which, in the particular circuit shown, may be of the order of 160 volts.

A half wave rectifier V2, shown as a double diode, is connected in series with two resistors R2 and R3 from the center tap 15 to one end of the secondary winding 14. A capacitor C3 is in parallel with the resistor R2 so that a D. C. voltage of approximately 100 volts appears thereacross.

A voltage regulator tube V3 is connected in series with a resistor R4 across the capacitor C2 so that a regulated voltage of approximately 150 volts appears across the rectifier tube V3. Four D. C. voltage supply lines, 17, 18, 19 and 20 are then provided from the power unit 10, as illustrated in the drawing. The first line 17 is connected to the positive terminal of capacitor C2 and is grounded. The second line 18 is connected to the anode of the rectifier tube V3 and is approximately 10 volts negative relative to line 17. The third line 19 is connected to the cathode of the rectifier V3 and therefore to the positive terminal of capacitor C3 and is approximately 150 volts negative relative to line 18. The fourth line 20 is connected to the negative terminal of the capacitor C3 and is approximately 100 volts negative relative to line 19. Of course, any suitable D. C. voltage supply source may be employed although a regulated voltage supply for the oscillator is desirable and I have found the specific supply unit described to be highly satisfactory.

The multivibrator oscillator 11 is of the well known positive bias type. It is supplied with the regulated voltage appearing between supply lines 18 and 19. The multivibrator comprises a twin triode, the halves of which are designated as V4 and V5. The anodes of tubes V4 and V5 are connected to line 18 through load resistors R5 and R6, respectively. These load resistors R5 and R6 are of a relatively low resistance to minimize the effects of tube and circuit capacitance in the multivibrator at the higher frequencies within the wide frequency band desired. The common cathode of tubes V4 and V5 is connected to supply line 19. The control grid of tube V4 is connected through a resistor R7 and a selected capacitor in the capacitor bank comprising capacitors C4, C5, C6, C7, C8 and C9 to the anode of tube V5. The control grid of tube V5 is connected to the anode of tube V4 through the resistor R8 and a selected capacitor of the capacitor bank comprising capacitors C4*a*, C5*a*, C6*a*, C7*a*, C8*a*, and C9*a*. The selectors 21 of the capacitor banks may be operated simultaneously to determine which of the capacitors are connected in their respective circuits at any selected setting and that corresponding capacitors in the two banks are simultaneously so connected.

The grids of tubes V4 and V5 are also connected together in a circuit which can be traced from the grid of tube V4 through the resistor R7, the parallel circuit comprising a variable resistor R9 on one side and a resistor R10, a pair of variable resistors R11 and R11*a* and a resistor R12 on the other side. The connection between the grids continues through resistor R8 to the grid of tube V5. A voltage divider comprising a pair of series connected resistors R13 and R13*a* is connected between supply lines 18 and 19. The junction between variable resistors R11 and R11*a* is connected through another resistor R14 to an adjustable tap on resistor R13. A capacitor C10 is also connected from the junction between resistors R11 and R11*a* to the supply line 19. To enable stabilization of the multivibrator by a synchronizing pulse, a terminal S1 is provided over which a synchronous input pulse may be supplied. A capacitor C11 and a resistor R15 are connected in series from the terminal S1 to the supply line 19. An adjustable tap on the resistor R15 is connected through a capacitor C12 and another resistor R16 to the grid of tube V4.

The operation of a positive bias multivibrator of this type is well known an consequently only a brief description thereof is needed here. If it is assumed that the capacitor banks are set as illustrated in the drawing and the tubes have already been warmed, then when voltage is applied to the multivibrator through lines 18 and 19, one of the tubes V4 or V5, because of transients or the absence of exact uniformity in the two tubes or their circuits, will conduct more current than the other. As a result a negative signal is passed from the anode of that one tube, because of the increased voltage drop across the corresponding load resistor R5 or R6, through the associated capacitor C6 or C6*a* to the grid of the other tube. The current through that other tube is thus reduced, which results in the grid of the aforesaid one tube becoming more positive to increase the current therethrough still further. It is apparent the effect is a cumulative one and the current through the one tube rapidly reaches a maximum while the current through the other tube is cut off. This circuit condition remains until the charge on the capacitor C6 or C6*a* connected to the grid of the other tube leaks off to permit current to again flow through the other tube. When this occurs the cumulative effect again takes place but in the reverse direction. Thus, the current flow shifts between tubes V4 and V5.

The output of the multivibrator is taken from the anode of tube V5. This output approaches a square wave but in itself is a very poorly shaped wave. The frequency of the output of the multivibrator is, of course, determined by the various capacitors and resistors in the circuit. The resistor R9 may be varied to provide a rather coarse frequency adjustment while adjustment of the tap on resistor R13 effects a finer control of frequency. The major frequency control is, of course, in the setting of the capacitor banks to permit operation of the multivibrator at a selected frequency over a wide frequency band. Variable resistors R11 and R11*a* may also be adjusted to control the width of the pulse provided by the multivibrator.

The amplifier 12 comprises three stages represented by tubes V6, V7 and V8 respectively. Tube V6 is connected as a pentode with its anode connected through resistor R17 to supply line 17 and its cathode connected to line 19. The screen grid 22 of tube V6 is connected to line 17 through a resistor R18 whereby a desired voltage is obtained on the screen grid. This screen grid voltage is stabilized by a capacitor C13 connected between the screen grid and the cathode.

The amplifier 12 is coupled to the multivibrator oscillator 11 by a novel coupling arrangement. Three resistors R19, R20 and R21 are connected in series between the anode of tube V5 of the oscillator and line 20 to form a voltage divider. An adjustable tap on the resistor R20 is connected to the control grid of tube V6 through a grid resistor R22. A capacitor C14 is connected directly between the anode of tube V5 and the adjustable tap on resistor R20.

The tap on resistor R20 is adjusted so that the voltage across the divider formed by resistors R19, R20 and R21, which voltage is derived from the anode of tube V5 of the multivibrator 11, tends to cause the voltage of the grid of tube V6 to alternate between a first voltage more negative than the cutoff voltage of the tube and a second voltage more positive than the voltage to which the grid is limited by the grid current. Thus, when tube V5 is conductive, the voltage of the grid tube V6 goes below cutoff and negative clipping of the wave produced by the multivibrator results. When tube V5 is non-conductive, the grid voltage of tube V6 tends to become highly positive but is limited to a value slightly above the cathode voltage and positive clipping results.

The capacitor C14 is provided to prevent distortion in the wave at high frequencies. At low frequencies, an efficient direct coupling, relatively free of distortion, is afforded by the arrangement of resistors R19, R20 and R21. However, when the multivibrator operates at a high frequency, the input capacitance of the tube V6 becomes appreciable and with the impedance offered by resistors R19 and R20 between the anode of tube V5 and the grid of tube V6, this input capacitance would, in the absence of capacitor C14, prevent the grid of tube V6 from following instantaneous voltage changes at the anode of tube V5. The capacitor C14 is of a size offering a relatively low impedance at high frequencies and so provides a low impedance path from the anode of tube V5 to the grid of tube V6. The capacitor C14 thus serves to balance out the effect of the input capacitance of the tube and thereby eliminates the distortion in the wave which otherwise would appear at high frequencies. At low frequencies, the capacitor C14 offers a relatively high impedance. However, the input capacitance of the tube V6 is not sufficiently great to cause appreciable distortion at these low frequencies. Thus, this coupling arrangement provides efficient coupling at both the high and low frequencies over a very wide frequency band.

The second stage of the amplifier 12, comprising tube V7, is connected to the first stage by a coupling arrangement similar to that between the oscillator and the first stage of the amplifier. Tube V7 is shown as a pentode connected as a triode with its anode connected to line 17 through a resistor R26 and its cathode connected to line 19. Resistors R23 and R24 are connected between the anode of tube V6 and the supply line 20. The junction between resistors R23 and R24 is connected to the control grid of tube V7 through a resistor R25 and a capacitor C15 is connected in shunt across the resistor R23.

As previously explained, the tube V6 of the first amplifier stage has a clipping action. Tube V6 also provides sufficient amplitude in its output voltage to permit further positive and negative clipping by the tube V7 of the second stage.

A pair of parallel connected capacitors C16 and C17 are connected in series with a resistor R27 between the adjustable tap on the resistor R26 and the line 17. An output terminal A is connected so that between terminal A and a grounded terminal G on line 17 there appears a square wave as produced across the resistor R27. The capacitor-resistor circuit C16, C17, and R27 provides a coupling whereby the output of the generator may be coupled to various other apparatus without affecting the generation of the square wave itself. The capacitors C16 and C17 are thus coupling capacitors. One of these capacitors C16 is quite large and is preferably an electrolytic capacitor, while the other capacitor C17 is quite small and is preferably a paper capacitor. Thus, the capacitor C17 can efficiently pass the high frequency while capacitor C16 efficiently passes the low frequency. An electrolytic capacitor C16 may be satisfactorily employed in this position in as much as the square wave has now been provided at a sufficiently amplified strength that any inaccuracies arising therefrom are negligible. Consequently, a leakage through the electrolytic capacitor will not have any material effect. It is also to be noted that the more positive terminal of the electrolytic capacitor C16 is connected to the ground through the resistor R27 to provide a polarizing potential to the capacitor to maintain it in good condition.

To obtain another square wave output 180° out of phase with that appearing between terminals A and G, the third stage is provided in the amplifier 12. Tube V8 is illustrated as a pentode connected as a triode with its anode connected through resistor R31 to line 17 and its cathode connected to line 19. Tube V8 is coupled to the output of tube V7 by coupling similar to that between tubes V7 and V6. This coupling comprises resistors R28 and R29 connected between the anode of tube V7 and line 20 and capacitor C18 connected in shunt across resistor R28 with the junction between resistors R28 and R 29 connected to the control grid of tube V8 through resistor R30.

The action of tube V8 is the same as that described for tube V7, but of course, the output will be 180° out of phase with the output of tube V7. The output for tube V8 is obtained between a terminal B and the ground terminal G. The terminal B is connected to the junction point between a resistor R32 connected in series with a pair of parallel capacitors C19 and C20; between an adjustable tap on resistor R31 and the line 17. Capacitors C19 and C20 are similar in structure and function to capacitors C16 and C17, respectively.

A synchronizing output impulse of fixed amplitude may be obtained from a terminal S2 connected through a capacitor C21 to the junction between a pair of resistors R33 and R34 connected between the anode of tube V8 and line 17. This synchronous output may be used for many purposes which are well known to those familiar with the use of square wave generators.

In a typical square wave generator constructed and operated satisfactorily and connected as shown in the drawings, the components have the following values or types:

*Tubes*

V1—524
V2—6H6
V3—VR-150
V4, V5—6SN7
V6, V7, V8—6AG7

*Capacitors*

C1, C2—40 mfd. 350 wv.
C3—16 mfd. 350 wv.
C4, C4a—2.0 mfd.
C5, C5a—0.2 mfd.
C6, C6a—0.015 mfd.
C7, C7a—0.00115 mfd.
C8, C8a—0.000075 mfd.
C9, C9a—0.000025 mfd.
C10—0.25 mfd.
C11, C17, C20—0.1 mfd.
C12—0.01 mfd.
C13, C16, C19, C21—50 mfd.
C14, C15, C18—25 mfd.

*Resistors*

R1—1500 ohms 25 w.
R2—16000 ohms
R3, R14—15000 ohms
R4—400 ohms 10 w.
R5, R6, R7, R8—5000 ohms R9—2 megohms
R10, R10a, R15, R18, R33—5000 ohms
R11, R11a, R16, R27, R32—100,000 ohms
R12—200,000 ohms
R13—25,000 ohms
R17—2500 ohms
R19, R21—360,000 ohms
R20—250,000 ohms
R22, R25, R30, R34—10,000 ohms
R23—510,000 ohms
R24—390,000 ohms
R26, R31—3,000 ohms
R28, R29—470,000 ohms While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claim.

What is claimed is:

A square wave generator comprising a resistive voltage divider having one end thereof connected to a source of voltage to be maintained at a first voltage level, means connected to said divider for impressing thereacross an oscillating voltage having a wave form approaching a square wave, said means being adjustable to provide said oscillating voltage at any selected frequency within a predetermined wide frequency band, an electronic amplifier tube having an anode and a cathode connected in an output circuit with the cathode connected to a source of voltage to be substantially maintained at a second voltage level more positive than said first level, said tube also having a control grid, a grid resistor connecting said grid to an intermediate point on said divider having a voltage below cut-off voltage of the grid during the more negative portion of the oscillating voltage and above said second level during the more positive portion of the oscillating voltage, and a shunting capacitor connected from the end of said divider opposite said one end to said point and offering relatively high impedance at low frequencies and relatively low impedance at high frequencies with said band.

CARL A. BERGFORS.

REFERENCES CITED

The following references are of record in the file of this patent:

UNITED STATES PATENTS

| Number | Name | Date |
|---|---|---|
| 2,118,626 | Smith | May 24, 1938 |
| 2,120,823 | White | June 14, 1938 |
| 2,131,566 | Lindenblad | Sept. 27, 1938 |
| 2,200,073 | Bedford | May 7, 1940 |
| 2,324,279 | Clark | July 13, 1943 |

Certificate of Correction

Patent No. 2,514,023

July 4, 1950

CARL A. BERGFORS

It is hereby certified that error appears in the printed specification of the above numbered patent requiring correction as follows:

Column 8, line 19, for the word "with" read *within*;

and that the said Letters Patent should be read as corrected above, so that the same may conform to the record of the case in the Patent Office.

Signed and sealed this 3rd day of October, A. D. 1950.

[SEAL]

THOMAS F. MURPHY,
*Assistant Commissioner of Patents.*